(12) United States Patent
Sugioka et al.

(10) Patent No.: US 8,405,389 B2
(45) Date of Patent: Mar. 26, 2013

(54) ATOMIC MAGNETOMETER AND MAGNETIC SENSING METHOD

(75) Inventors: Hideyuki Sugioka, Ebina (JP); Sunao Ichihara, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 304 days.

(21) Appl. No.: 12/740,059

(22) PCT Filed: Dec. 26, 2008

(86) PCT No.: PCT/JP2008/073964
§ 371 (c)(1),
(2), (4) Date: Apr. 27, 2010

(87) PCT Pub. No.: WO2009/084731
PCT Pub. Date: Jul. 9, 2009

(65) Prior Publication Data
US 2011/0193555 A1   Aug. 11, 2011

(30) Foreign Application Priority Data

Dec. 28, 2007 (JP) ................................. 2007-340474

(51) Int. Cl.
*G01R 33/02* (2006.01)
(52) U.S. Cl. .................................................... 324/244.1
(58) Field of Classification Search .................. None
See application file for complete search history.

(56) References Cited

U.S. PATENT DOCUMENTS

| 3,863,144 A | 1/1975 | Simpson et al. ........... 324/0.5 R |
| 4,516,073 A * | 5/1985 | Doriath et al. ............. 324/244.1 |
| 4,731,581 A | 3/1988 | Doriath et al. ................ 324/244 |
| 6,433,543 B1 * | 8/2002 | Shahinpoor et al. ....... 324/244.1 |

(Continued)

FOREIGN PATENT DOCUMENTS

EP   0130901   1/1985
WO   WO 2008149957 A2 * 12/2008

OTHER PUBLICATIONS

S.I. Kanorsky et al., "Quantitative Investigation of the Resonant Nonlinear Faraday Effect Under Conditions of Optical Hyperfine Pumping", *Phys. Rev. A*, vol. 47, No. 2, pp. 1220-1226 (Feb. 1993).

(Continued)

*Primary Examiner* — Jermele M Hollington
(74) *Attorney, Agent, or Firm* — Fitzpatrick, Cella, Harper & Scinto

(57) ABSTRACT

An atomic magnetometer includes a light source for a probe beam and a medium in which the probe beam is to be propagated. The medium is a substance which changes a polarization rotation angle of the probe beam depending on a magnetic field intensity at a first measurement position and a magnetic field intensity at a second measurement position different from the first measurement position. The atomic magnetometer directly measures a difference between the magnetic field intensity at the first measurement position and the magnetic field intensity at the second measurement position as a difference in polarization rotation angle, along a propagation path of the probe beam.

9 Claims, 7 Drawing Sheets

U.S. PATENT DOCUMENTS

| | | | |
|---|---|---|---|
| 7,038,450 B2 | 5/2006 | Romalis et al. | 324/304 |
| 7,656,154 B2 * | 2/2010 | Kawabata et al. | 324/244.1 |
| 8,054,074 B2 * | 11/2011 | Ichihara et al. | 324/304 |
| 2004/0140799 A1 | 7/2004 | Romalis et al. | 324/301 |
| 2007/0120563 A1 * | 5/2007 | Kawabata et al. | 324/244.1 |
| 2009/0243610 A1 | 10/2009 | Ichihara et al. | 324/301 |
| 2010/0156419 A1 * | 6/2010 | Sugioka | 324/318 |
| 2011/0025323 A1 * | 2/2011 | Budker et al. | 324/304 |
| 2011/0031969 A1 * | 2/2011 | Kitching et al. | 324/304 |

OTHER PUBLICATIONS

V. Acosta et al., "Nonlinear Magneto-Optical Rotation with Frequency-Modulated Light int eh Geophysical Field Range", *Phys. Rev. A*, vol. 73, No. 5, pp. 053404-1 to 053404-8 (2006).

E. Hodby et al., "Differential Atomic Magnetometry Based on Diverging Laser Beam", *Appl. Phys. Letters*, vol. 91, No. 1, pp. 011109-1 to 011109-3 (2007).

* cited by examiner

ATOMIC MAGNETOMETER AND MAGNETIC SENSING METHOD

TECHNICAL FIELD

The present invention relates to a magnetometer for measuring a magnetic field intensity. Particularly, the present invention relates to an atomic magnetometer using alkali metal gas or rare gas and a magnetic sensing method.

BACKGROUND ART

A high-sensitivity atomic magnetometer using spin of alkali metal gas or rare gas has been proposed. U.S. Pat. No. 7,038,450 has proposed an atomic magnetometer in which a cell including an alkali metal vapor is irradiated with linearly polarized light (beam) from a linearly polarized light source for a pump beam and with circularly polarized light (beam) from a circularly polarized light source for a probe beam. Further, in order to measure a polarization rotation angle of the probe beam, a photo-diode array is used as a photo-detector.

Incidentally, information on a magnetic field intensity (strength) depending on a measurement position is measured as magnetic field gradient information in some cases. In such cases, differential information of the magnetic field intensity (magnetic field gradient information) is obtained by using differential information on electric signals obtained by being detected through a photo-detector provided correspondingly to each of measurement positions.

However, actually, it is considered that a condition concerning an amplification factor or noise of an individual photo-detector per se is not strictly uniformized. That is, when the magnetic field gradient information is intended to be obtained by using the electric signals obtained from the photo-detector, there is liability to mixing of noise, on the basis of characteristic difference between individual photo-detectors, in the magnetic field gradient information.

DISCLOSURE OF THE INVENTION

In view of the above-described liability, as a result of study, the present inventors have reached a conclusion that it is possible to measure a magnetic field gradient with high sensitivity by measurement performed by replacing a difference in minute magnetic field intensity on the basis of a difference in measurement position with a difference in polarization rotation angle of a laser beam for a linear polarization probe.

A principal object of the present invention is to provide an atomic magnetometer capable of measuring a magnetic field gradient with high sensitivity.

Another object of the present invention is to provide a magnetic sensing method capable of measuring the magnetic field gradient with high sensitivity.

According to an aspect of the present invention, there is provided an atomic magnetometer comprising:

a light source for a probe beam; and
a medium in which the probe beam is to be propagated,
wherein the medium is a substance which changes a polarization rotation angle of the probe beam depending on a magnetic field intensity at a first measurement position and a magnetic field intensity at a second measurement position different from the first measurement position, and
wherein the atomic magnetometer directly measures a difference between the magnetic field intensity at the first measurement position and the magnetic field intensity at the second measurement position as a difference in polarization rotation angle, along a propagation path of the probe beam.

According to another aspect of the present invention, there is provided a magnetic sensing method for measuring a polarization rotation angle of a probe beam by irradiating an atomic group contained in a hollow portion of a cell with a pump beam to uniformize directions of spin of atoms constituting the atomic group and then by irradiating the atomic group uniformized in spin direction of the atoms with linearly polarized light as the probe beam, the magnetic sensing method comprising:

introducing the probe beam having a direction (plane) of polarization rotated by a magnetic field intensity at a first measurement position to a second measurement position different from the first measurement position so as to permit optical subtraction of the polarization rotation angle of the probe beam; and obtaining information on a difference between a magnetic field intensity at the first measurement position and a magnetic field intensity at the second measurement position by measuring the polarization rotation angle of the probe beam having passed through the second measurement position.

According to a further aspect of the present invention, there is provided an atomic magnetometer comprising:

a cell having a hollow portion;
an atomic group contained in the hollow portion of the cell;
a pump beam light source for uniformizing a direction of spin of a plurality of atoms constituting the atomic group;
a light source, for the probe beam, for irradiating the cell with linearly polarized light as the probe beam; and
a detector for detecting information on a polarization rotation angle of the linearly polarized light,
wherein an irradiation direction of the circularly polarized light as a pump beam for the atomic group in the cell and an irradiation direction of the probe beam for the atomic group intersect with each other at a first measurement position, and an irradiation direction of the circularly polarized light as a pump beam for the atomic group in the cell and an irradiation direction of the probe beam for the atomic group having passed through the first measurement position intersect with each other at a second measurement position different from the first measurement position, and
wherein the atomic magnetometer is configured to perform optical subtraction between the polarization rotation angle of the probe beam on the basis of the magnetic field intensity at the first measurement position and the polarization rotation angle of the probe beam on the basis of the magnetic field intensity at the second measurement position.

According to the present invention, it is possible to provide a high-sensitivity sensor by directly measuring a difference between magnetic field intensities at different two positions as a difference in polarization rotation angle of the probe beam.

These and other objects, features and advantages of the present invention will become more apparent upon a consideration of the following description of the preferred embodiments of the present invention taken in conjunction with the accompanying drawings.

BEST MODE FOR CARRYING OUT THE INVENTION

First Embodiment

Magnetic Sensing Method

The magnetic sensing method according to the present invention in this embodiment will be described with reference to FIG. 1.

The magnetic sensing method in this embodiment has the following features.

That is, directions of spin of atoms constituting an atomic group contained in a hollow portion of a cell are uniformized by irradiating the atomic group with a pump beam. Then, the atomic group uniformized in spin direction of the atoms is irradiated with linearly polarized light as a probe beam to measure an angle of rotation of a plane of polarization of the probe beam, so that information on a measured magnetic field intensity is obtained.

Figure 1:
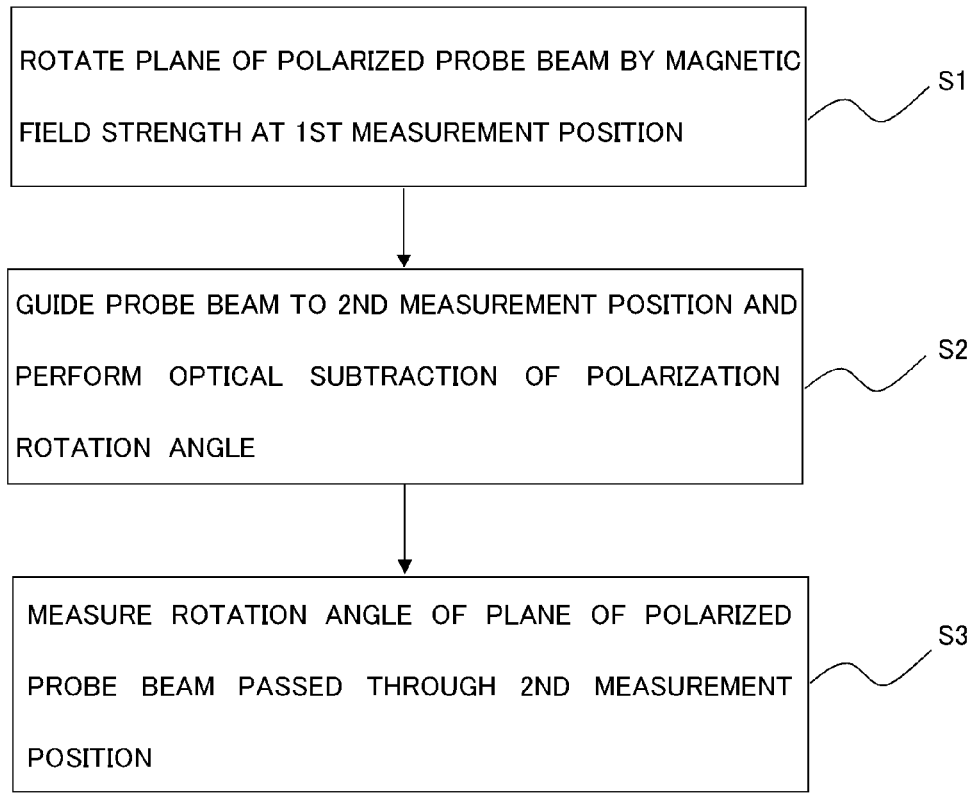
FIG. 1 is a flow chart for illustrating a magnetic sensing method according to the present invention.

In this embodiment, as shown in FIG. 1, first, a direction of polarization of the probe beam is rotated by a magnetic field intensity at a first measurement position (S1). Then, the probe beam with the rotated direction of polarization by the magnetic field intensity at the first measurement position is guided to a second measurement position so as to permit optical subtraction of polarization rotation angles of the probe beam (S2). Next, an angle of rotation of a plane of polarization of the probe beam having passed through the second measurement position is measured (S3). As a result, it is possible to obtain information on a difference between magnetic field intensities at mutually different two positions.

Characteristic elements in the magnetic sensing method using an atomic magnetometer will be described in detail.
A: Cell A cell is constituted by a material, such as glass or plastics, capable of passing a probe beam or a pump beam through the cell. In the cell, alkali metal (such as K or Rb) is contained in a gas state as an atomic group or an atomic cluster. If the alkali metal is placed in the gas state (vaporized) during the sensing, the alkali metal is not necessarily required to be placed in the gas state when the sensing is not made. For example, potassium (alkali metal) is placed in a glass cell and is heated at about 180° C., so that the glass cell can be filled with vapor of potassium.

The atomic group contained in the cell is not limited to alkali metal atoms but may also be any material so long as the sensing method can be performed by using the material. Further, in the cell, it is also possible to contain buffer gas in addition to the above-described atomic group. As the atomic group, in addition to K or Rb, Xe or the like may also be mixed.
B: Pump Beam The pump beam may desirably be consisting of circularly polarized light itself, i.e., only consisting of the circularly polarized light but in this embodiment, inclusion of another polarization component is not excluded so long as the pump beam includes the circularly polarized light.

The pump beam is used for uniformizing directions of electron spin of the respective atoms constituting the atomic group. Specifically, the electron spin directions can be uniformized by utilizing a phenomenon which is called circular polarization pumping. By using a right-hand circular polarization pump beam, directions of spin of atoms which are directed randomly can be uniformized in a traveling direction of the pump beam. By using a left-hand circular polarization pump beam, the directions of spin of the atoms can be uniformized in a direction opposite to the traveling direction of the pump beam. The uniformization of the directions of spin of the atoms means, in a precise sense, that directions of electro spin are uniformized in the case where the substance to be contained in the cell is alkali metal and that directions of atomic nuclear spin (nuclear spin) are uniformized in the case where the substance is rare (noble) gas.

The reason why the spin directions can be uniformized as described above is that the circularly polarized light has angular momentum and therefore based on low of conservation of angular momentum, there is a spin direction in which light is not absorbed. Once excited atoms emit beams in random polarization states by spontaneous emission and can create mutually different ground states. However, by repeating such pumping, it is possible to finally uniformize the directions of spin of the respective atoms constituting the atomic group.
C: Probe Beam The probe beam may desirably be detuned from a resonance frequency of the atoms to some extent in order to avoid unnecessary pumping or in order to avoid absorption. The probe beam may desirably be consisting only of the linearly polarized light but in the present invention, inclusion of another polarization component is not excluded so long as the probe beam includes a linearly polarized light component.

A device is configured so that an irradiation direction of the probe beam for the atoms in the cell and an irradiation direction of the pump beam for the atoms in the cell intersect with each other at respective measurement positions. The irradiation directions of the probe beam and the pump beam are not particularly limited so long as the irradiation directions intersect with each other but are generally configured to intersect with each other at right angles.

It is known that a plane of polarization is rotated by a magneto-optical effect which can be called Faraday effect in a broad sense including non-linear Faraday effect, Cotton-Mouton effect, and the like, when the linearly polarized light is incident on a polarized atomic group with respect to X-direction. Specifically, an angle of polarization of the probe beam traveling along the incident direction is rotated in a yz-plane by a measurement magnetic field which is parallel or perpendicular to the probe beam. A magnetometer utilizing a change in this angle of rotation correspondingly to a magnitude of the magnetic field has been known.

Also in this embodiment, the polarized atomic group is formed by the above-described pump beam and the probe beam is directed to the atomic group in the cell, so that information on a polarization rotation angle of the probe beam before and after the probe beam passes through the cell is obtained.

With respect to a light source, an individual light source may be used for each of the pump beam and the probe beam and it is also possible to create circularly polarized pump beam and linearly polarized probe beam by using a common light source and a polarizing plate or the like. As the light source for outputting the pump beam and the probe beam, a laser light source can be used. For example, in the case of using potassium as the atomic group or the atomic cluster in the cell, a laser light source with a wavelength of about 770 nm detuned in a range from 0.02 nm to 1 nm can be utilized.

D: Obtainment of Information on Angle of Rotation of Plane of Polarization of Probe Beam Information on an angle of rotation of a plane of polarization (or a direction of polarization) can, e.g., be obtained by detecting a probe beam having passed through the above-described cell with a photo-diode array through the polarizing plate. It is also possible to appropriately employ means other than the detecting means (the photo-diode array) so long as the information can be obtained by the means.

Specifically, the polarization rotation angle of the probe beam is detected by a crossed nicol polarimeter or a balanced polarimeter. Details are shown in Embodiments appearing hereinafter.

E: Method of Performing Optical Subtraction (Optical Computing (Operation))

In the case where differential information on magnetic field intensity at mutually differential two measurement positions (including the case where these two measurement positions are located in not only the same cell but also different cells) are obtained by the magnetic sensing method using the atomic magnetometer, the following factors (1) to (4) are appropriately combined for each of the measurement positions.

(1) Direction of the circularly polarized light as the pump beam incident on the measurement position (2) Rotational direction of the circularly polarized light as the pump beam (right-hand circularly polarized light or left-hand circularly polarized light)

(3) Direction of the probe beam incident on the measurement position (4) Presence or absence of an operation with respect to a polarization rotation angle of the probe beam Second Embodiment Atomic Magnetometer An atomic magnetometer in this embodiment has the following features.

Specifically, the atomic magnetometer includes a cell having a hollow portion, an atomic group contained in the hollow portion, and a pump beam light source for uniformizing directions of spin of a plurality of atoms constituting the atomic group. The atomic magnetometer further includes a probe beam light source for irradiating the cell with linearly polarized light as the probe beam, and a detector for detecting information on an angle of rotation of a plane of polarization of the linearly polarized light.

With respect to the atomic group in the cell, an irradiation direction of the circularly polarized light providing the pump beam and an irradiation direction of the probe beam are configured to intersect with each other at a first measurement position.

Then, with respect to the atomic group in the cell, an irradiation direction of the circularly polarized light providing the pump beam and an irradiation direction of the probe beam having passed through the first measurement position are configured to intersect with each other at a second measurement position. Further, a polarization rotation angle of the probe beam by a magnetic field intensity at the first measurement position and a polarization rotation angle of the probe beam by a magnetic field intensity at the second measurement position are configured to be subjected to optical subtraction.

Specifically, as a constitution for performing the optical subtraction, the following constitutes (1) to (4) may be employed but the present invention is not limited to the constitutions (1) to (4).

Figure 2:
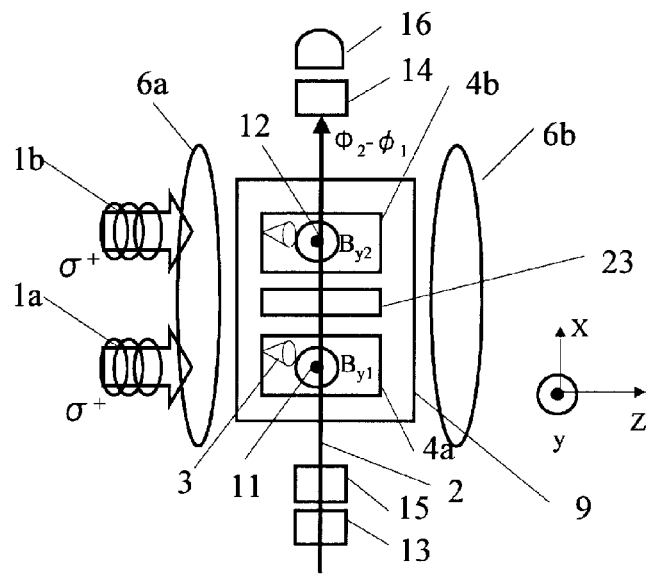
FIG. 2 is a schematic view for illustrating Embodiment 1.

(1) The first measurement position and the second measurement position are located in a first cell and a second cell, respectively, and a half-wave plate configured to pass the probe beam therethrough is provided between the first cell and the second cell (FIG. 2).

Figure 3:
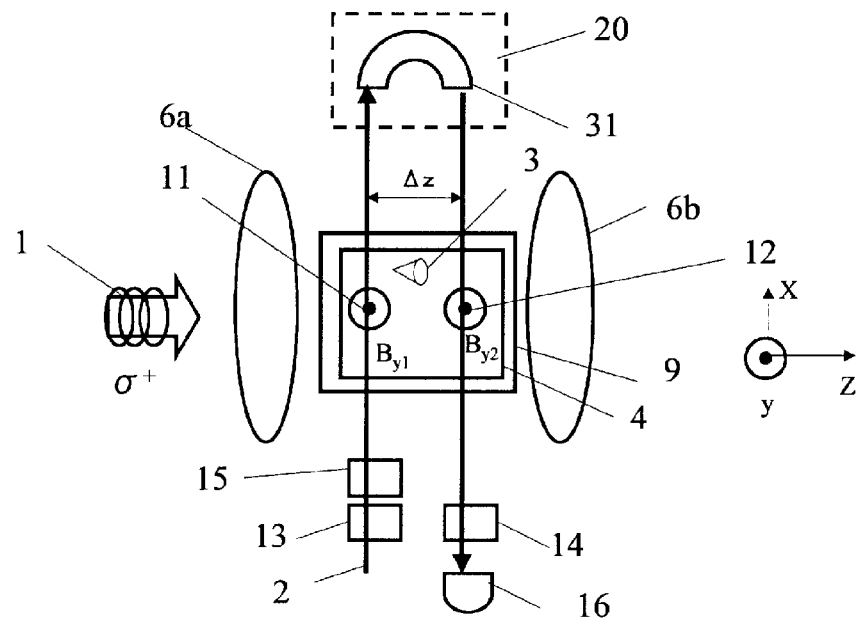
FIG. 3 is a schematic view for illustrating Embodiment 2.
Figure 4:
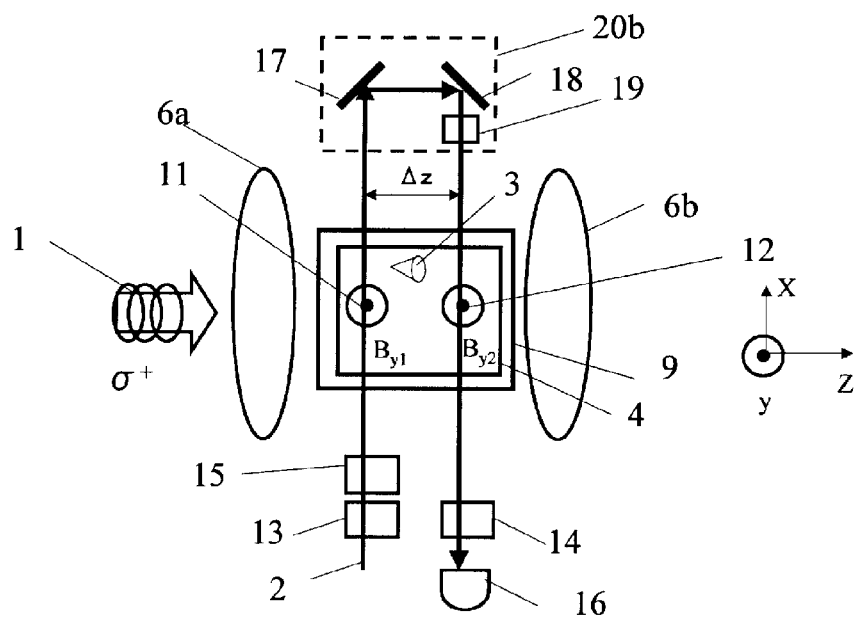
FIG. 4 is a schematic view for supplementally illustrating Embodiment 2.

(2) The first measurement position and the second measurement position are located in the cell, and optical path converting means for passing the probe beam, having passed through the first measurement position, through the second measurement position with an opposite traveling direction is provided (FIGS. 3 and 4).

Figure 5:
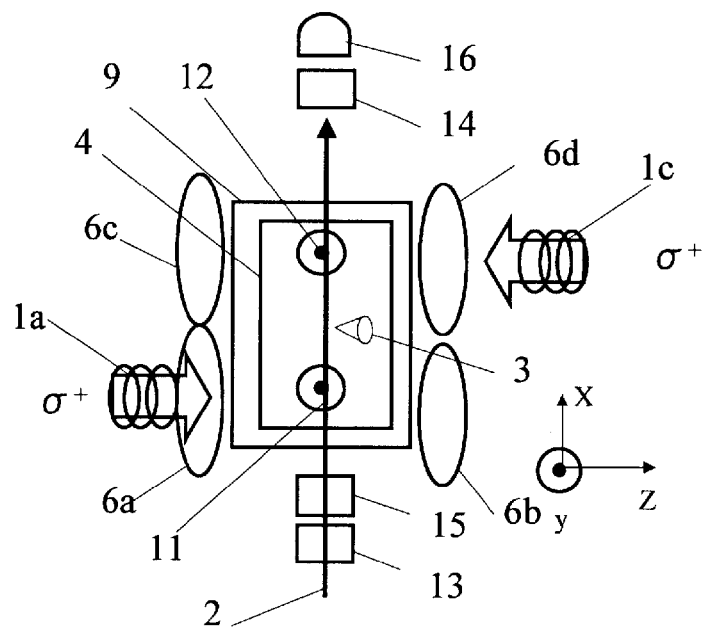
FIG. 5 is a schematic view for illustrating Embodiment 3.

(3) The first measurement position and the second measurement position are located in the cell, and both of the circularly polarized light for irradiation at the first measurement position and the circularly polarized light for irradiation at the second measurement position are either one of right-hand circularly polarized light and left-hand circularly polarized light, and the circularly polarized light for irradiation at the first measurement position and the circularly polarized light for irradiation at the second measurement position have traveling directions opposite from each other (FIG. 5).

Figure 6:
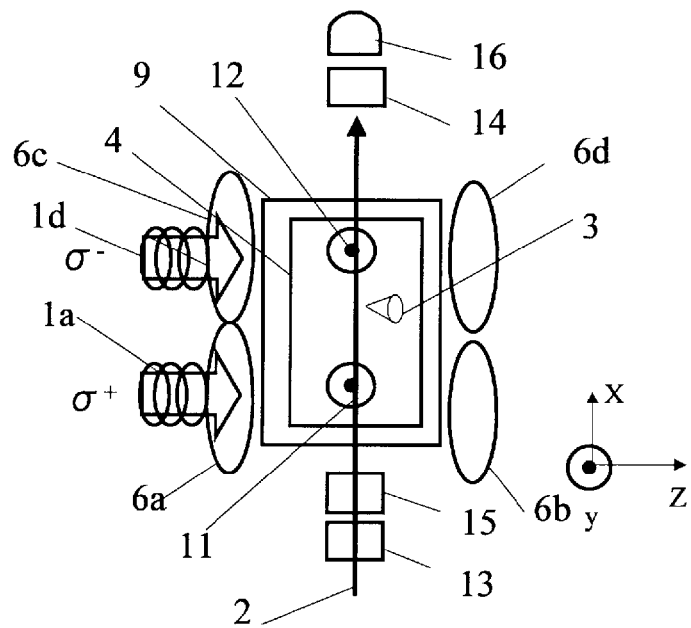
FIG. 6 is a schematic view for illustrating Embodiment 4.

(4) The first measurement position and the second measurement position are located in the cell, and the circularly polarized light for irradiation at the first measurement position and the circularly polarized light for irradiation at the second measurement position have polarization directions opposite from each other and have the same traveling direction (FIG. 6).

Figure 7:
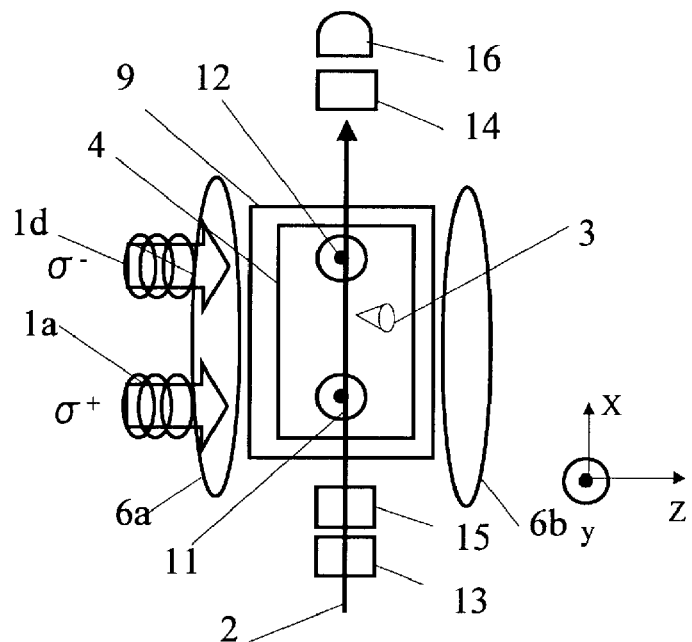
FIG. 7 is a schematic view for supplementally illustrating Embodiment 4.
Figure 8:
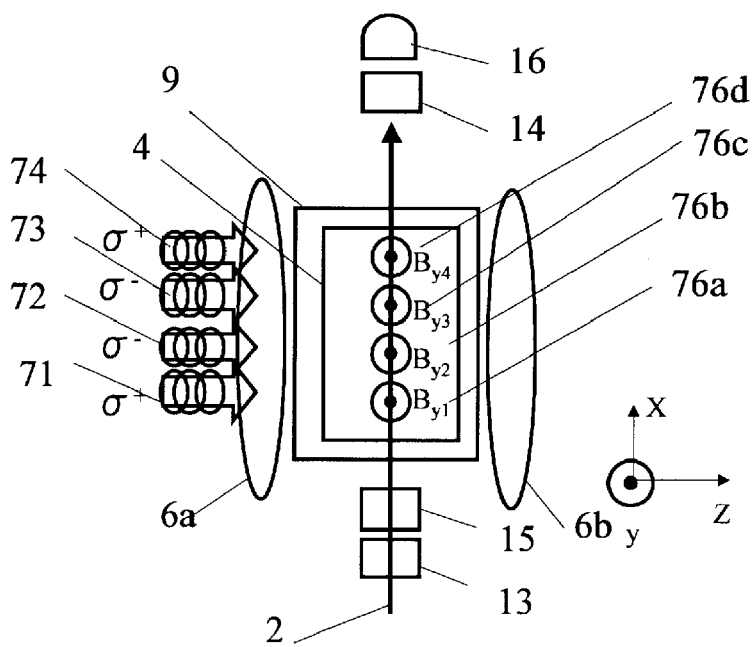
FIG. 8 is a schematic view for illustrating Embodiment 5.
Figure 10:
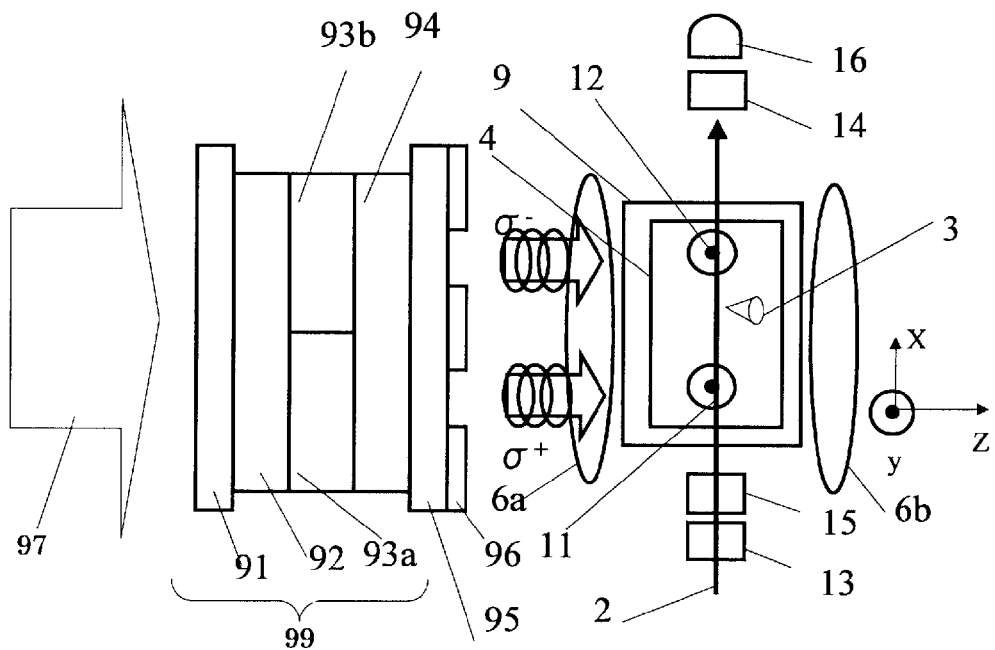
FIG. 10 is a schematic view for illustrating Embodiment 7.

In this embodiment, the atomic magnetometer may also be configured to have a measurement position which is different from the first measurement position and the second measurement position which are located in the same cell (FIGS. 7, 8 and 10).

Figure 9:
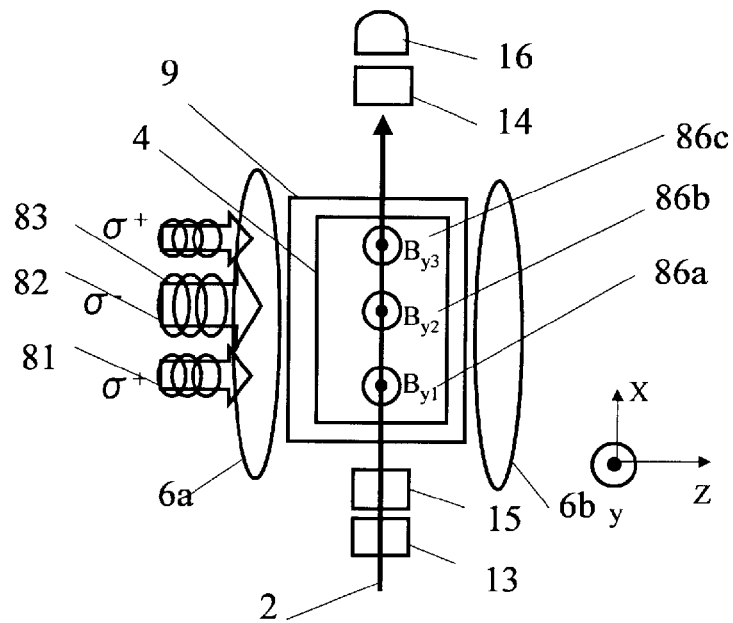
FIG. 9 is a schematic view for illustrating Embodiment 6.

Further, the atomic magnetometer may also be configured to pass laser light from the pump beam light source through a member including a polarization element for equalizing a light intensity of right-hand circularly polarized light with a light intensity of left-hand circularly polarized light and then to pass circularly polarized light through the cell (FIGS. 9 and 10).

Further, in this embodiment, as the cell in which the atomic group is incorporated, it is also possible to use different cells depending on the respective measurement positions. Further, a plurality of measurement positions different from each other may be located in the same cell. However, in the case of using the different cells, it is preferable that the type and an amount of the atomic group to be incorporated in each of the cells are strictly uniformized.

Third Embodiment

Magnetometer

The above-described First Embodiment and Second Embodiment are explained on the premise that the circularly polarized light is used as the pump beam but as shown below, the pump beam is not always required.

Specifically, a magnetometer in this embodiment is provided with a light source for a probe beam and a medium through which the probe beam is configured to propagate.

The medium is a substance which changes a polarization rotation angle depending on a magnetic field intensity at a first measurement position and a magnetic field intensity at a second measurement position and may specifically be vapor of alkali metal such as potassium or cesium. Further, rare gas (noble gas) such as helium or xenon may also be utilized. Further, it is also possible to employ substances, such as magnetic materials including Fe, Co, Ni, $Y_3Fe_{12}$, MnSb, MnBi, $YFeO_3$, $NdFe_3$, $CrBr_3$, EuO, $CdCv_2S_4$, etc., and glass and the like. Further, a (magnetic field) gradiometer can also be realized by directly measuring a difference between a magnetic field intensity at the first measurement position and a magnetic field intensity at the second measurement position in the medium along a propagation path of the probe beam.

These constitutions are described in detail in Embodiments 8 and 9 appearing hereinafter.

Hereinbelow, the present invention will be described based on specific embodiments.

Embodiment 1

FIG. 2 is a schematic view showing a characterizing portion of Embodiment 1 of the present invention.

Referring to FIG. 2, reference symbols 1a and 1b represent a laser beam for circular polarization pumping, a reference numeral 2 represents a laser beam for linear polarization probe (probe beam), and a reference numeral 3 schematically illustrates alkali metal vapor or rare gas as precession of spin.

In cells 4a and 4b, alkali metal vapor or rare gas is filled. Further, in FIG. 2, Helmholtz coils 6a and 6b for cancelling a static magnetic field in z-axis direction or applying a bias magnetic field in z-axis direction are schematically illustrated. By providing Helmholtz coils also with respect to y-axis direction and x-axis direction, three-axis Helmholtz coils (not shown) may also be employed.

A first measurement position 11 is located in the cell 4a and a second measurement position 12 is located in the cell 4b. Polarizing plates 13 and 14 are disposed at positions so that polarizing axes are perpendicular to each other, i.e., are disposed at crossed nicol positions. A Faraday modulator 15 is used for imparting minute vibration of an angle of rotation to a probe beam. A photo-detector 16 is constituted by a photo-diode or the like. A temperature control oven 9 keeps a temperature of the alkali metal cells 4a and 4b at a constant temperature. In the oven 9, a half-wave plate 23 is disposed. When an angle of rotation of a plane of polarization of the probe beam (linearly polarized light) having passed through the first measurement position 11 is $+\phi$ with respect to a crystal axis of the half-wave plate 23, the rotation angle is inverted in sign to $-\phi$ with respect to the crystal axis of the half-wave plate 23 after the probe beam passes through the half-wave plate 23.

A magnetic field intensity (magnetic flux density) in y-axis direction at the first measurement position 11 is taken as By1 and a magnetic field intensity in y-axis direction at the second measurement position 12 is taken as By2.

A magnetometer in this embodiment includes the probe beam, a medium which changes a polarization rotation angle depending on a magnetic field intensity during propagation of the probe beam, and the first and second measurement positions for the medium. The magnetometer is characterized in that a difference between the magnetic field intensity at the first measurement position and the magnetic field intensity at the second measurement position is directly measured as a difference in polarization rotation angle along a propagation path of the probe beam.

In this embodiment, in an atomic magnetometer using the probe beam and alkali metal vapor or rare gas, such a constitution that the cells 4a and 4b, the probe beam 2, and the first and second measurement positions 11 and 12 are used is adopted. By directly measuring a difference between the magnetic field intensities at the first and second measurement positions, i.e., (By2-By1) as a difference in polarization rotation angle ($\phi 2-\phi 1$), a high-sensitivity sensor suppressing mixing of noise due to a difference between photo-sensors is provided.

Particularly, in this embodiment, the half-wave plate 23 is used to invert a polarization rotation different after the probe beam passes through the first cell 4a and then the probe beam passes through the second cell 4b. As a result, the magnetic field intensity difference (By2-By1) between the first and second measurement positions 11 and 12 is directly measured as the polarization rotation angle difference ($\phi 2-\phi 1$) to provide the high-sensitivity magnetometer which has suppressed the mixing of noise due to the difference between the photo-sensors.

The atomic magnetometer which performs magnetic measurement by incidence of the circularly polarized laser light (the pump beam) and the probe beam on the cell in which the alkali metal vapor or the like is filled is based on the following principle. The atomic magnetometer measures rotation of spin of electron excited by the circularly polarized laser beam (the pump beam) in a measurement magnetic field with macro magnetization as rotation of the incident linearly polarized light as the probe beam with respect to a polarization direction and thus is capable of measuring a static magnetic field or an oscillating magnetic field with high sensitivity.

In an xyz coordinate system shown in FIG. 2, first, a system in which the circularly polarized laser lights 1a and 1b are emitted in z-axis direction, the probe beam (the linearly polarized light) is emitted in x-axis direction, and a magnetic field By to the measured is present in y-axis direction is considered. In this case, a macro magnetization vector m=(mx, my, mz) of the electron spin is represented by the following optical Bloch equation:

$$dm/dt = \Omega \times m - \gamma_{eff} m + P \quad (1)$$

As described above, m=(mx, my, mz) represents the macro magnetization of the excited electron spin and $\omega$ (0, $\omega$eff, 0) is a parameter with respect to the magnetic field. P=(0, 0, P) represents a parameter with respect to the pump beam and $\gamma$eff represents a parameter with respect to relaxation. Further, $\omega$eff=$\gamma$eBy/Q, $\gamma$eff=$(R_{SD}+R_P)/Q$, P=$R_P$/Q, and $\gamma$e=g&mYB/h are satisfied. Q is a slow down factor, h is a Planck constant, (=2.0023) is g-factor, $R_P$ is an optical pumping rate, $R_{SD}$ is a spin relaxation rate, and $\mu$B is Bohr magneton.

In the case where By is the static magnetic field, a stationary solution of the equation (1) is, from dm/dt=0, as follows:

$$(mx,my,mz)=(P\Omega eff/(\Omega eff^2+\gamma eff^2),0,-P\gamma eff/(\Omega eff^2+\gamma eff^2)) \quad (2).$$

In this case, with respect to the probe beam which is the linearly polarized light propagating in x-axis direction, a polarization rotation angle $\phi$ by a magnetic field with respect to its polarization direction when a right-hand screw rotation direction is taken as a positive direction with respect to x-axis direction is represented by the following equation:

$$\phi (=\pi L\ (n^+-n^-)/\lambda)=2\ \pi Lmx(n0-1)/\lambda \quad (3).$$

In the equation (3), L represents a propagation distance, $\lambda$ represents a wavelength, $n^+$ and $n^-$ represent a refractive index with respect to right-hand circularly polarized light and a refractive index with respect to left-hand circularly polarized light, respectively, and n0 represents a refractive index of a medium in the case of no spin polarization.

From the equations (2) and (3), when the magnetic field By is weak and the approximation: $\Omega$eff<<$\gamma$eff can be made, the polarization rotation angle by the static magnetic field is represented as follows:

$$\phi = \alpha A By \quad (4).$$

$$\alpha A = 2\pi L(n0-1)P\gamma e/(\lambda Q\gamma\text{eff}^2) \quad (5).$$

Therefore, the rotational direction of the polarization rotation angle $\phi$ depends on a sign of mx ($=P\Omega/\gamma\text{effP}^2$), thus finally depending on a sign of PBy. The sign of $P=R_F/Q$ is positive for the right-hand circularly polarized light in z-axis direction, negative for the left-hand circularly polarized light in z-axis direction, negative for the right-hand circularly polarized light in −z-axis direction, and positive for the left-hand circularly polarized light in −z-axis direction.

In Embodiment 1, between the polarizing plates 13 and 14 disposed so that their polarization transmission axis directions intersect each other at right angles, a minute oscillation angle F ($=\Delta\phi F0\exp[-i\omega Ft]$) is provided by the Faraday modulator 15. Then, from the oscillation angle F providing a dark state, a polarization rotation angle by the alkali metal vapor cell between the polarizing plates is measured. The Faraday modulator has an angular frequency $\omega F$. When an initial polarization rotation angle after the probe beam 2 is changed into linearly polarized light by the polarizing plate 13 is $\phi 0$ (=0) with respect to the crystal axis of the half-wave plate 23, the probe beam is rotated $\phi 1$ (=$\alpha A$By1) in the cell 4a. For that reason, the polarization rotation angle after the probe beam passes through the cell 4a is $\phi F+\phi 0+\phi 1$.

Then, the half-wave plate 23 shifts a phase by $\pi$(rad), so that the sign of the polarization rotation angle is inverted with respect to the crystal angle of the half-wave plate 23 after the probe beam passes through the half-wave plate 23. As a result, the polarization rotation angle is $-(\phi F+\phi 0+\phi 1)$. Then, the probe beam is rotated $\phi 2$ (=$\alpha A$By2) in the cell 4b, so that the polarization rotation angle after the probe beam passes through the cell 4b is $-(\phi F+\phi 0+\phi 1-\phi 2)$. Therefore, from the oscillation angle $\phi F$ providing the dark state, a polarization rotation angle ($-\phi 0-\phi 1+\phi 2$) by the alkali metal vapor cell between the polarizing plates is measured. When $\phi 0=0$, the difference in magnetic field intensity can be directly measured as a difference ($\phi 2-\phi 1$) in polarization rotation angle. Further, even when $\phi 0$ is not zero, $\phi 0$ is constant, so that the difference in magnetic field intensity can be directly measured as the difference in polarization rotation angle.

Here, a conventional atomic magnetometer constituting a gradiometer by measuring values of $\phi 1$ and $\phi 2$ separately by polarization rotation meters (polarimeters) will be considered.

As the polarimeter, similarly as in Embodiment 1, when the crossed nicol polarization consisting of the pair of polarizing plates, the Faraday modulator, and the photo-sensor is considered, the conventional atomic magnetometer requires two polarimeters.

The polarimeter is generally a device for providing a signal V ($=\beta\phi$) to a polarization rotation angle $\phi$ and with respect to this signal V, a measurement magnetic field By is obtained as By=qV (=q$\beta\phi 1$) where q and $\beta$ are constants of proportionality.

Particularly, $\beta$ is the constant of proportionality depending on a characteristic of the polarimeter or the photo-sensor constituting the polarimeter. When constants of proportionality of the two polarimeters are $\beta 1$ and $\beta 2$, signals are V1 and V2, and signal noises resulting from the photo-sensor or the like are $\delta V1$ and $\delta V2$, the two signals V1 and V2 are V1=$\beta 1\phi 1+\delta V1$ and V2=$\beta 2\phi 2+\delta V2$. Incidentally, $\delta V2$ has the same order as $\delta V1$ and $\delta V$. Therefore, a difference between a magnetic field intensity at the first measurement position and a magnetic field intensity at the second measurement position ($\Delta$By21=By2−By1) is represented by the following equation:

$$\Delta By21 = (q\beta 2\phi 2 - q\beta 1\phi 1) + q(\delta V2 - \delta V1) \quad (6).$$

With respect to the second term of this equation (6), $\delta V2$ and $\delta V1$ are different in phase, so that q($\delta V2-\delta V1$) has the same order as q$\delta V$.

Further, from the first term of the equation (6), in the case where $\phi 1$ and $\phi 2$ are very close to each other, it is understood that the magnetic field intensity difference between the first and second measurement positions ($\Delta$By21=By2−By1) cannot be accurately measured in a strict sense unless $\beta 1$ and $\beta 2$ are ideally equal to each other.

On the other hand, in the present invention in which the magnetic field intensity difference between the first and second measurement positions (By21=By2−By1) is directly measured as the difference in polarization rotation angle ($\phi 2-\phi 1$), a single (only one) polarimeter is used. Therefore, it is understood that the magnetic field intensity difference can be measured with accuracy even in the case of a small difference in polarization rotation angle ($\phi 2-\phi 1$), from the following equation:

$$\Delta By21 = q\beta(\phi 2-\phi 1) + q\delta V \quad (7).$$

In Embodiment 1, the crossed nicol polarimeter is used but it is also possible to use the balanced polarimeter.

In the present invention, when the crossed nicol polarimeter is used, the number of photo-sensors can be decreased from two to one. Further, when the balanced polarimeter is used, the number of photo-sensors can be decreased from four to two. In Embodiment 1, as the alkali metal, potassium is used but it is also possible to similarly user rubidium, cesium, and the like. The present invention is also similarly applicable to an ordinary atomic magnetometer using alkali metal gas or rare gas.

In this embodiment, the case of the weak magnetic field is described but is understood that the present invention is also similarly applicable to the case of a strong magnetic field. Further, in this embodiment, the static magnetic field measurement or the like of a low frequence to the extent that the magnetic field can be regarded as the static magnetic field is described but the present invention achieves a similar effect with respect to oscillating magnetic field measurement.

The oscillating magnetic field measurement will be described below. In the case where By represents an oscillating magnetic field with an angular frequency $\omega$, By is defined as By=By0$e^{-i\omega t}$ and then a forced vibration (oscillation) solution is obtained. Further, when an angular frequency by a bias magnetic field for resonance Bz0 applied with respect to z-axis direction is $\omega 0$ and a real part of mx is S, the following equation is satisfied.

$$S = \gamma\text{eff }mz\gamma eBy0\cos(\omega t)/(Q((\omega-\omega 0)^2 + \gamma\text{eff}^2)))) \quad (8).$$

In this case, a polarization rotation angle $\phi$ by a magnetic field with respect to a polarization direction of the probe beam which is linearly polarized light propagating in x-axis direction when a direction of a right-hand screw is taken as a positive direction with respect to x-axis direction can be represented by the following equation:

$$\phi = 0.5Lrec_fD1nS[-DD1(v) + DD2(v)] \quad (9).$$

In the equation (9, ν represents a frequency of the probe beam, n represents an atomicity density, c represents a light velocity, and re ($=2.82\times10^{-15}$ m) represents classical electron radius.

In this embodiment, potassium (K) is used for the alkali metal vapor, fD1 is ⅓, and the term [−DD1(ω)+DD2(ω)] shows a dispersion relationship between D1 line and D2 line of potassium in consideration of wavelength dispersion of the D1 line and the D2 line. Therefore, from the equations (8) and (9), the polarization rotation angle for the oscillating magnetic field is represented by the following equations:

$$\phi = \alpha BBy0 \quad (10).$$

$$\alpha B = 0.5L \text{rec} fD1n[-DD1(\omega)+DD2(\omega)]\gamma \text{eff} mz\gamma eBy0 \cos(\omega t)/(Q((\omega-\omega 0)^2+\gamma \text{eff}^2)) \quad (11).$$

Accordingly, it is understood that the rotational direction of φ depends on the sign of mzBy0 cos (ωt). The sign of mz is positive for the right-hand circularly polarized light in z-axis direction, negative for the left-hand circularly polarized light in z-axis direction, negative for the right-hand circularly polarized light in −z-axis direction, and positive for the left-hand circularly polarized light in −z-axis direction. Further, compared with a period T=2 π/w, a time period in which the light passes through the cells 4a and 4b at the light velocity c is negligible, so that it is considered that cos(ωt) at the passing of light through the cell 4a is identical to that at the passing of light through the cell 4b.

Therefore, the polarization angle after the light passes through the cells 4a and 4b and the half-wave plate is represented by the following equation:

$$\Delta\phi = \phi 2 - \phi 1 = \alpha B(By02 - By01) \quad (12),$$

wherein $By1 = By01e^{-i\omega t}$ and $By2 = By02e^{-i\omega t}$.

As described above, also in the case of the oscillating magnetic field measurement, it is understood that a high-sensitivity atomic magnetometer which suppresses the mixing of noise due to the difference between the photo-sensors can be provided by directly measuring the magnetic field intensity difference (By2−By1) as the polarization rotation angle difference (φ2−φ1).

Embodiment 2

FIG. 3 is a schematic view showing a characterizing portion of Embodiment 2 of the present invention.

Referring to FIG. 3, reference numeral 1 represents a circularly polarized laser beam, a reference numeral 2 represents a laser beam for probe (probe beam), and a reference numeral 3 schematically illustrates alkali metal vapor or rare gas as precession of spin. In a cell 4, alkali metal vapor or rare gas is filled. Further, in FIG. 2, three-axis Helmholtz coils 6a and 6b for cancelling a static magnetic field or applying a bias magnetic field in z-axis direction are schematically illustrated.

A first measurement position 11 and a second measurement position 12 are located in the cell 4. Polarizing plates 13 and 14 are disposed at crossed nicol positions. An atomic magnetometer in this embodiment further includes a Faraday modulator 15, a photo-detector 16, a temperature control oven 9 for keeping a temperature of the alkali metal cell 4 at a constant temperature, and a polarization-maintaining fiber 20 as a polarization-maintaining optical path fold-back means.

In this embodiment, the atomic magnetometer using the circularly polarized laser beam 1, the probe beam 2, and the alkali metal vapor is characterized by the following constituents.

That is, the atomic magnetometer includes the cell 4 in which the alkali metal vapor is filled, the circularly polarized laser beam (circularly polarized light) 1 for exciting the alkali metal vapor, the probe beam 2 emitted perpendicularly to the circularly polarized light 1, and the polarization-maintaining optical path fold-back means 20. Then, the probe beam 2 passes through the second measurement position 12 after it passes through the first measurement position 11 and the optical path of the probe beam 2 is folded back by using the polarization-maintaining optical path fold-back means 20. Thus, the magnetic field intensity difference between the first and second measurement positions (By2−By1) is directly measured as the polarization rotation angle difference (φ2−φ1). As a result, a high-sensitivity atomic magnetometer which suppresses the mixing of noise due to the difference between the photo-sensors is provided.

In Embodiment 1, the sign inversion operation of φ1 is performed but in this embodiment (Embodiment 2), the sign inversion operation of φ1 is performed by using the polarization-maintaining optical path fold-back means 20, so that (arithmetic) processing of the difference in polarization rotation angle is performed.

Now, an initial polarization rotation angle after the probe beam 2 is changed into circularly polarized light by the Polarizing late 14 is taken as φ0 (=0) when the right-hand screw direction is taken as positive with respect to x-axis direction. The probe beam 2 passes through the first measurement position 11 in the cell 4 to be rotated φ1 (=αABy1), so that the polarization rotation angle is φF+φ0+φ1. In this case, as described in Embodiment 1, φf is the minute angle of oscillation φF (=ΔφF0exp[−iωFt]) provided by the Faraday modulator 15 between the polarizing plates 13 and 14.

The probe beam 2 having passed through the cell 4 is thereafter folded back toward −x-axis direction by using the polarization-maintaining optical path fold-back means 20 to have a polarization direction symmetrical with respect to the y-axis, so that the sign of the polarization rotation angle is inverted to result in a polarization rotation angle of −(φ+φ0+φ1).

Further, for the fold-back probe beam, the pump beam is emitted in z-axis direction with respect to a traveling direction (−x-axis direction) of the probe beam, so that the rotational direction of the polarization rotation angle is inverted with respect to the traveling (−x-axis) direction. However, with respect to x-axis direction, the probe beam is still rotated in the right-hand screw direction, so that the probe beam passes through the second measurement position 12 to be rotated +φ2 (=αABy2).

Therefore, after the probe beam passes through the second measurement position 12, the polarization rotation angle is −(φF+φ0+φ1−φ2). That is, similarly as in Embodiment 1, it is possible to provide a high-sensitivity magnetometer having suppressed the mixing of noise due to the difference between the photo-sensors by directly measuring the magnetic field intensity difference (By2−By1) between the first and second measurement positions 11 and 12 as the polarization rotation angle difference (φ2−φ1).

In FIG. 3, as the polarization-maintaining optical path fold-back means 20, the polarization-maintaining fiber is used but it is also possible to use a polarization-maintaining optical path fold-back means 20b constituted by two mirrors 17 and 18 and a phase adjusting plate 19.

The phase adjusting plate 19 is used to correct elliptically polarized light, by reflection principally due to dielectric loss of the mirrors 17 and 18, to linearly polarized light but in the case where polarization reflection characteristic of the mirrors 17 and 18 is regarded as being good, the phase adjusting plate 19 can be omitted a minute polarization rotation angle φM which is regarded as a constant value based on the reflection characteristic of the mirrors can be added but the polarization rotation angle φM is the constant value, thus being no problem. As the mirrors 17 and 18, particularly, by using a multilayer reflection mirror, it is possible to design the mirrors so that the elliptically polarized light is suppressed and the polarization direction is inverted by fold-back similarly as in the case of the above-described polarization-maintaining fiber.

Embodiment 3

FIG. 5 is a schematic view for illustrating Embodiment 3 of the present invention.

In this embodiment, an atomic magnetometer using the pump beam, the probe beam and the alkali metal vapor is characterized by the following constituents.

The atomic magnetometer includes an alkali metal vapor 3, a cell in which the alkali metal vapor 3 is filled, first and second pump beams 1a and 1c for polarizing electron spin of the alkali metal vapor 3 at different positions, and a probe beam 2 emitted perpendicular to the first and second pump beam 1a and 1c.

The first and second pump beam 1a and 1c are emitted in directions opposite from each other and then the probe beam passes through a first measurement position 11 for the first pump beam 1a and thereafter passes through a second measurement position 12 for the second pump beam 1c. By directly measuring a magnetic field intensity difference (By2−By1) between the first and second measurement positions 11 and 12 as a polarization rotation angle difference (φ2−φ1), a high-sensitivity magnetometer having suppressed the mixing of noise due to the difference between the photo-sensors is provided.

More specifically, as shown in FIG. 5, the first pump beam which is right-hand circularly polarized light is directed to the first measurement position 11 in z-axis direction and the second pump beam which is right-hand circularly polarized light is directed to the second measurement position 12 in −z-axis direction. The linearly polarized probe beam is directed to the first and second measurement positions 11 and 12 in x-axis direction.

As described in Embodiment 1, when the incident direction of the circularly polarized pump beam is inverted, the rotational direction of the polarization rotation angle with respect to the magnetic field is inverted. Thus, the probe beam passes through the first and second measurement positions excited by the oppositely directed pump beams, so that optical subtraction of the polarization rotation angles can be performed.

Now, an initial polarization rotation angle after the probe beam 2 is changed into circularly polarized light by the Polarizing late 14 is taken as φ0 when the right-hand screw direction is taken as positive with respect to x-axis direction. The probe beam 2 passes through the first measurement position 11 in the cell 4 to be rotated φ1 (=αABy1), so that the polarization rotation angle is φF+φ0+φ1.

Further, the probe beam 2 passes through the second measurement position 12 different in pump beam traveling direction in the cell 4 to be rotated −φ2 (=−αABy2). Therefore, after the probe beam 2 passes through the second measurement position 12, the polarization rotation angle is (φF+φ0+φ1−φ2). Similarly as in Embodiment 1, Embodiment 3 has such an effect that it is possible to provide a high-sensitivity magnetometer having suppressed the mixing of noise due to the difference between the photo-sensors by directly measuring the magnetic field intensity difference (By2−By1) between the first and second measurement positions 11 and 12 as the polarization rotation angle difference (φ2−φ1).

In FIG. 5, codirectional Helmholtz coils 6a, 6b, 6c and 6d for performing resonance measurement of the oscillating magnetic field by applying bias magnetization permits resonance measurement with subtraction processing. Further, in FIG. 5, reference numerals or symbols identical to those in FIGS. 1 to 3 represents means or portions having the same functions as those shown in FIGS. 1 to 3.

Embodiment 4

FIG. 6 is a schematic view for illustrating Embodiment 4 of the present invention.

In this embodiment, an atomic magnetometer using the pump beam, the probe beam and the alkali metal vapor is characterized by the following constituents.

The atomic magnetometer includes an alkali metal vapor 3, a cell in which the alkali metal vapor 3 is filled, first and second pump beams 1a and 1d for polarizing electron spin of the alkali metal vapor 3 at different positions, and a probe beam 2 emitted perpendicular to the first and second pump beam 1a and 1d.

The first and second pump beam 1a and 1d are directed so as to be opposite in rotational direction of circularly polarized light from each other and then the probe beam passes through a first measurement position 11 for the first pump beam 1a and thereafter passes through a second measurement position 12 for the second pump beam 1d. By directly measuring a magnetic field intensity difference (By2−By1) between the first and second measurement positions 11 and 12 as a polarization rotation angle difference (φ2−φ1), a high-sensitivity magnetometer having suppressed the mixing of noise due to the difference between the photo-sensors is provided.

More specifically, as shown in FIG. 6, the first pump beam which is right-hand circularly polarized light is directed to the first measurement position 11 in z-axis direction and the second pump beam which is left-hand circularly polarized light is directed to the second measurement position 12 in z-axis direction. The linearly polarized probe beam is directed to the first and second measurement positions 11 and 12 in x-axis direction.

As described in Embodiment 1, when the circular polarization rotational direction of the circularly polarized pump beam is inverted, the rotational direction of the polarization rotation angle with respect to the magnetic field is inverted. Thus, the probe beam passes through the first and second measurement positions excited by the oppositely directed pump beams with the opposite circular polarization rotational directions, so that optical subtraction of the polarization rotation angles can be performed.

Now, an initial polarization rotation angle after the probe beam 2 is changed into circularly polarized light by the Polarizing late 14 is taken as φ0 when the right-hand screw direction is taken as positive with respect to x-axis direction. The probe beam 2 passes through the first measurement position 11 in the cell 4 to be rotated φ1 (=αABy1), so that the polarization rotation angle is φF+φ0+φ1.

Further, the probe beam 2 passes through the second measurement position 12 different in circular polarization rotational direction of the pump beam in the cell 4 to be rotated −φ2 (=−αABy2). Therefore, after the probe beam 2 passes through the second measurement position 12, the polarization rotation angle is (φF+φ0+φ1−φ2). Similarly as in Embodiment 1 and Embodiment 3, it is possible to provide a high-sensitivity magnetometer having suppressed the mixing of noise due to the difference between the photo-sensors by directly measuring the magnetic field intensity difference (By2−By1) between the first and second measurement positions 11 and 12 as the polarization rotation angle difference ($\phi 2-\phi 1$).

In FIG. 5, two pairs of Helmholtz coils 6a, 6b, 6c and 6d are used but these Helmholtz coils 6a, 6b, 6c and 6d may also be replaced with a pair of Helmholtz coils 6a and 6b as shown in FIG. 7. Further, in FIGS. 6 and 7, reference numerals or symbols identical to those in FIGS. 1 to 3 represents means or portions having the same functions as those shown in FIGS. 2 to 4.

Embodiment 5

FIG. 8 is a schematic view for illustrating Embodiment 5 of the present invention.

In this embodiment, particularly, an atomic magnetometer using the probe beam and the alkali metal vapor or the rare gas includes a cell 4 in which the alkali metal vapor or the rare gas is filled, a plurality of measurement positions 76a to 76d, and a probe beam 2 configured to pass through the plurality of the measurement positions 76a to 76d. A high-sensitivity sensor having suppressed the mixing of noise due to the difference between the photo-sensors is provided by directly measuring amounts of high-order gradient of magnetic field intensity at the plurality of the measurement positions 76a to 76d as amounts of optical processing of polarization rotation angle of the probe beam 2.

Specifically, as shown in FIG. 8, a right-hand circularly polarized pump beam is directed to the measurement positions 76a and 76d with respect to z-axis direction and a left-hand circularly polarized pump beam is directed to the measurement positions 76b and 76c with respect to z-axis direction. The probe beam 2 which has been linearly polarized is directed to the measurement positions 76a to 76d with respect to x-axis direction.

As described in Embodiment 1, when a circular polarization rotational direction of the circularly polarized pump beam is inverted, a rotational direction of a polarization rotation angle with respect to the magnetic field is inverted. The probe beam 2 successively passes through the measurement positions 76a to 76d excited by the pump beam for right-hand circular polarization, left-hand circular polarization, left-hand circular polarization and right-hand circular polarization, respectively. As a result, a high-order gradient of magnetic field intensity (By4−By3−By2+By1)/(dx)$^2$ at the plurality of measurement positions can be measured directly as an optical processing amount of polarization rotation angle ($\phi 4-\phi 3-\phi 2+-1$). In this case, $\phi 4$, $\phi 3$, $\phi 2$ and $\phi 1$ represent polarization rotation angles of the probe beam corresponding to magnetic fields By4, By3, By2 and By1, respectively. The gradient satisfies: (By4−By3−By2+By1)/(dx)$^2$=((By4−By3)/dx−(By2−By1)/dx))/dx, thus being secondary gradient at the measurement position.

By constituting such an n-order gradiometer, it is possible to eliminate (n−1)-order noise gradient, so that a sensor suitable for measurement of biological information or the like can be constituted by less photo-detecting devices.

Embodiment 6

FIG. 9 is a schematic view for illustrating Embodiment 6 of the present invention.

Embodiment 6 is the same as Embodiment 5 except that the secondary gradiometer is constituted by three measurement positions 86a, 86b and 86c.

Specifically, as shown in FIG. 9, a right-hand circularly polarized pump beam is directed to the measurement positions 86a and 86c with respect to z-axis direction with a width w (<2 dx) and a left-hand circularly polarized pump beam is directed to the measurement position 86b with respect to z-axis direction with a width 2 w (<2 dx). The probe beam 2 which has been linearly polarized is directed to the measurement positions 86a to 86c with respect to x-axis direction.

As described in Embodiment 1, when a circular polarization rotational direction of the circularly polarized pump beam is inverted, a rotational direction of a polarization rotation angle with respect to the magnetic field is inverted. The probe beam 2 successively passes through the measurement positions 86a to 86c excited by the pump beam for right-hand circular polarization, left-hand circular polarization and right-hand circular polarization, respectively. As a result, a high-order gradient of magnetic field intensity (By3−2By2+By1)/(dx)$^2$ at the plurality of measurement positions can be measured directly as an optical processing amount of polarization rotation angle ($\phi 4-\phi 3-\phi 2+\phi 1$). In this case, $\phi 3$, $\phi 2$ and $\phi 1$ represent polarization rotation angles of the probe beam corresponding to magnetic fields By3, By2 and By1, respectively. The gradient satisfies: (By3−2By2+By1)/(dx)$^2$= ((By3−By2)/dx−(By2−By1)/dx))/dx, thus being secondary gradient at the measurement position.

Embodiment 7

FIG. 10 is a schematic view for illustrating Embodiment 7 of the present invention.

In this embodiment, particularly, an optical gradiometer is constituted by using a device 99 including a plurality of polarizing elements 93a and 93b, which have polarization angles different by 90 degrees from each other, disposed in an array on a substrate to constitute a minute array for right-hand circular polarization and left-hand circular polarization so that optical processing can be performed. By this constitution, compared with the case where an independent polarizing element is held in a polarizing plate holder and is independently disposed, an apparatus can be simplified and downsized. Further, the constitution in this embodiment is suitable for microfabrication by the use of MEMS (micro electro mechanical system) technique or the like.

Specifically, the device 99 includes a pair of glass substrates 91 and 95 between which a film-like polarizing element 92 for adjusting polarization, film-like polarizing elements 93a and 93b with polarization angles different by 90 degrees from each other, and a ¼ (quarter)-wave plate 94 are sandwiched. By such a constitution, a minute right-hand circular polarization/left-hand circular polarization array can be prepared. More specifically, the polarization direction of the polarizing element 92 is y-axis direction, the polarization direction of the polarizing element 93a is +45 degrees from y-axis direction toward z-axis direction when a right-hand screw direction is taken as a positive direction, and the polarization direction of the polarizing element 93b is −45 degrees from y-axis direction toward z-axis direction. The polarizing element 92 has the function of equalizing light intensities of right-hand circularly polarized light and left-hand circularly polarized light which are created by passing of a pump beam (laser beam) 97 through the polarizing elements 93a and 93b and the ¼-wave plate 94, irrespective of a polarization state of the pump beam 97, thus being effective in downsizing the resultant apparatus.

The glass substrate 95 is provided with a minute aperture 96 for determining a width and a magnitude of the circularly polarized light. The aperture 96 has an important functional effect on weighting of optical computing. Further, wavelengths of the pump beam and the probe beam are locked.

Figure 11:
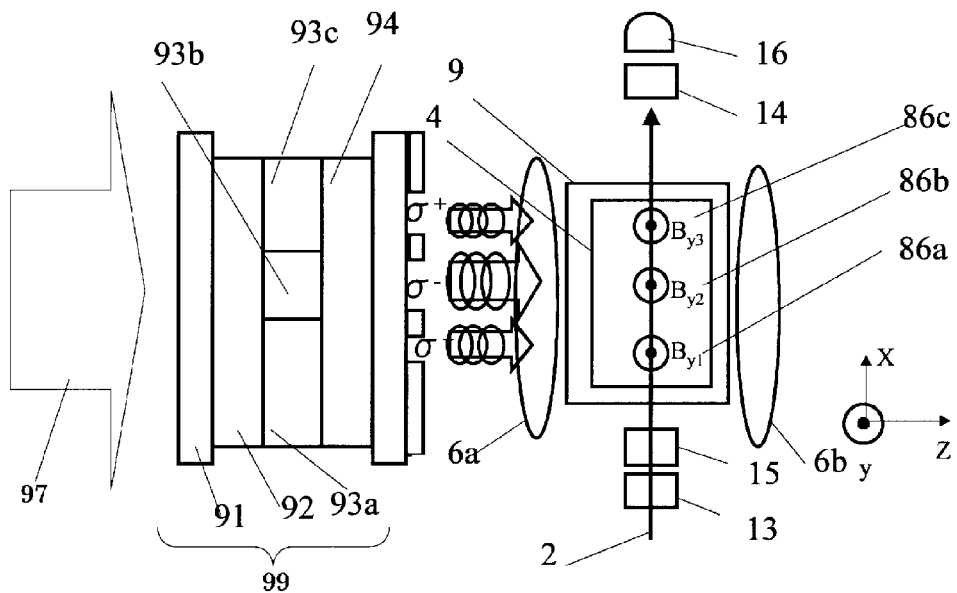
FIG. 11 is a schematic view for supplementally illustrating Embodiment 7.

FIG. 11 shows a high-order gradiometer constituted by disposing a plurality of polarizing elements, which have polarization angles different by 90 degrees from each other, on a substrate in an array. By this constitution, a plurality of circularly polarized lights different in rotational direction can be disposed at close positions, so that an effect such that gradient information can be detected at the close positions achieved.

Embodiment 8

Figure 12:
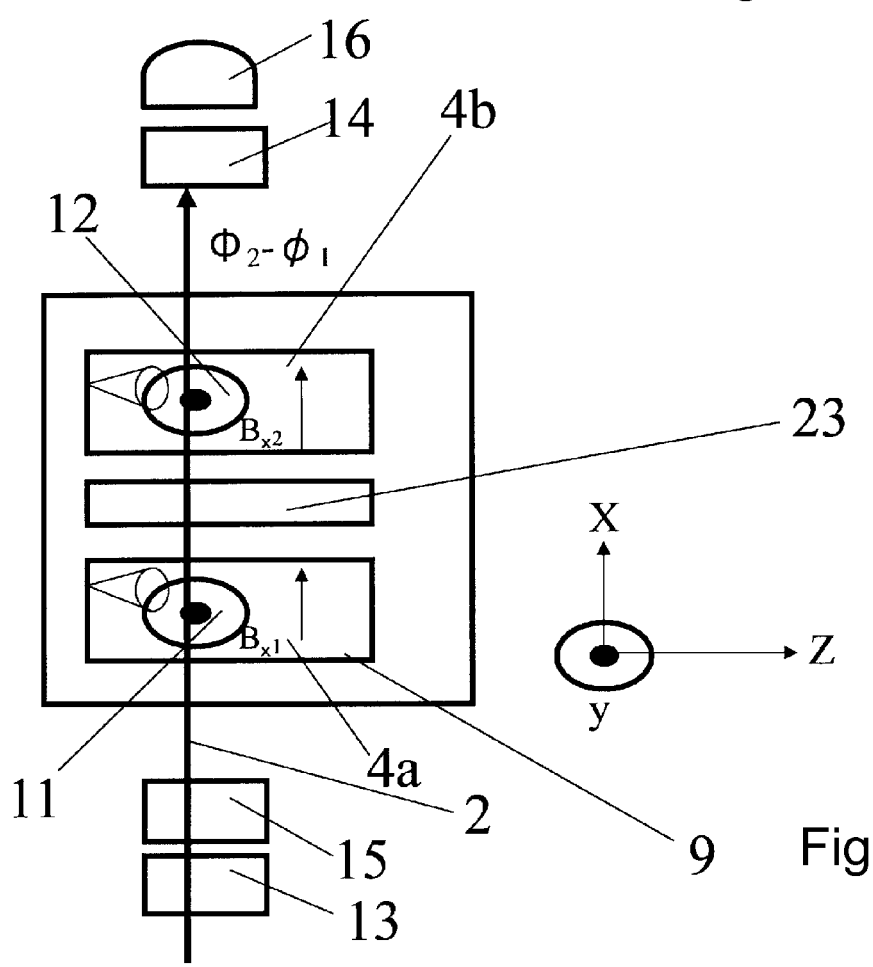
FIG. 12 is a schematic view for illustrating Embodiment 8.

FIG. 12 is a schematic view for illustrating Embodiment 8.

In Embodiment 1, the atomic magnetometer (particularly of SERF (spin-exchange relaxation free) type) using the probe beam and the pump beam is described. In this embodiment, an atomic magnetometer using only the probe beam is employed.

That is, Embodiment 8 is the same as Embodiment 1 except that the atomic magnetometer is operated only by the probe beam and that the probe beam and a direction of a measurement magnetic field are parallel to each other. By the function of the half-wave plate 23, a difference between magnetic field intensities at two measurement positions can be detected as a difference in polarization rotation angle. However, in this embodiment, the difference in detected magnetic field intensity is a difference in magnetic field intensity in x-axis direction (Bx2−Bx1). The atomic magnetometer in which the probe beam and the magnetic field direction are parallel to each other and the pump beam is not employed is, e.g., described in detail in Phys. Rev. A47, 1220-1226 (1993).

That is, it is understood that the present invention is not limited to the atomic magnetometer using both of the probe beam and the pump beam. The present invention is also applicable to other atomic magnetometers including an atomic magnetometer of FM-NMOR (frequency-modulated nonlinear magneto-optical rotation)-type as described in Phys. Rev. A73, 053404 (2006).

Embodiment 9

Figure 13:
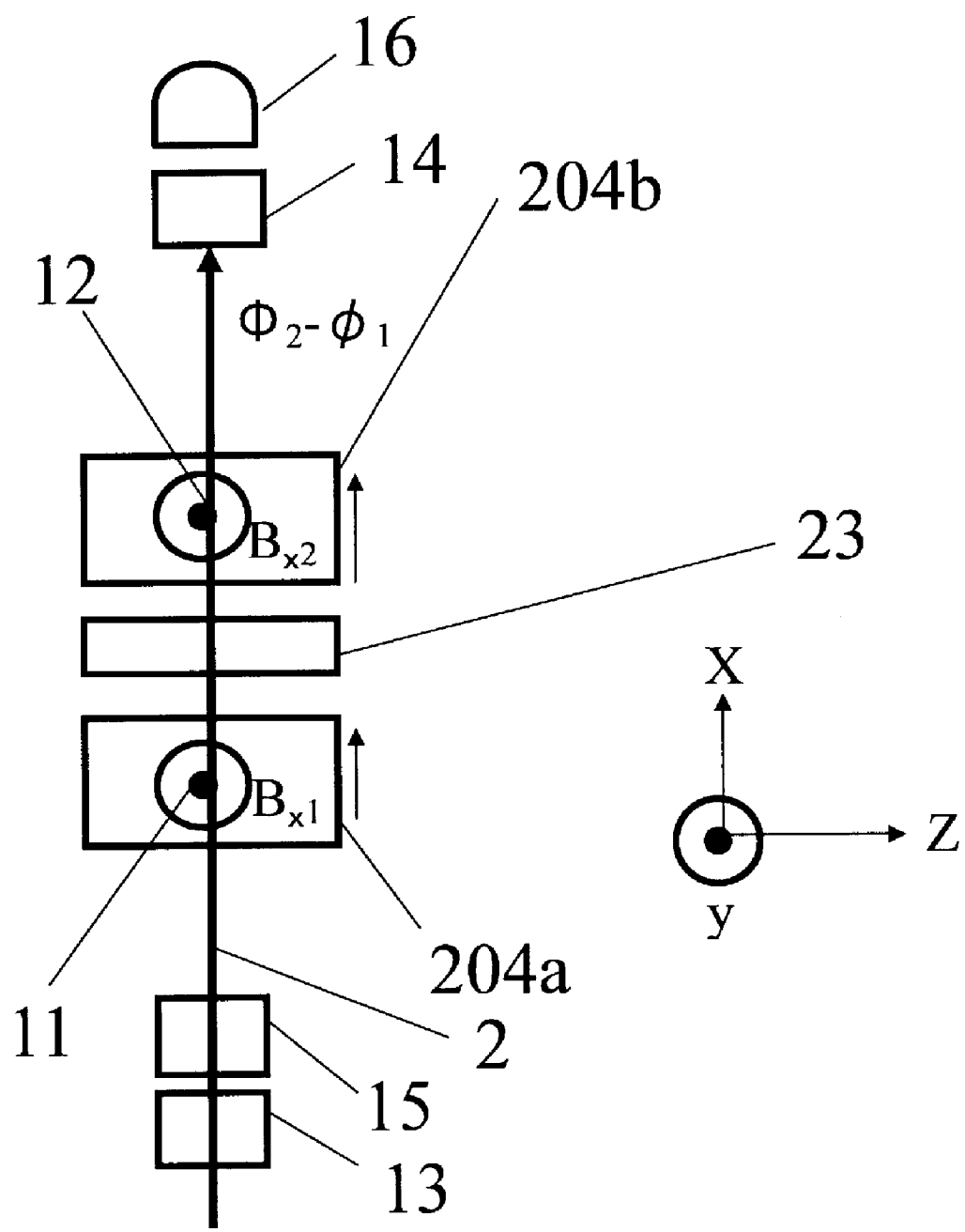
FIG. 13 is a schematic view for illustrating Embodiment 9.

FIG. 13 is a schematic view for illustrating a characterizing portion of Embodiment 9.

Embodiment 9 is the same as Embodiments 1 and 8 except that the medium providing the polarization rotation angles $\phi 1$ and $\phi 2$ is changed from the alkali metal vapor or the rare gas to a medium such as glass which achieves the linear Faraday effect in a narrow sense. In this embodiment, by the function of the half-wave plate 23 a difference between magnetic field intensities at two measurement positions can be detected as a difference in polarization rotation angle.

INDUSTRIAL APPLICABILITY

As described hereinabove, the present invention is not limited to the atomic magnetometer but is also applicable to any magnetometer for measure a magnetic field intensity as a magnitude of a polarization rotation angle of a probe beam.

While the invention has been described with reference to the structures disclosed herein, it is not confined to the details set forth and this application is intended to cover such modifications or changes as may come within the purpose of the improvements or the scope of the following claims.

The invention claimed is:

1. An atomic magnetometer comprising:
a light source for a probe beam; and
a medium in which the probe beam is to be propagated,
wherein said medium is a substance which changes a polarization rotation angle of the probe beam depending on a magnetic field intensity at a first measurement position and a magnetic field intensity at a second measurement position different from the first measurement position, and
wherein said atomic magnetometer optically measures directly a difference, on a propagation path of the probe beam, between the magnetic field intensity at the first measurement position and the magnetic field intensity at the second measurement position as a difference in polarization rotation angle.

2. A magnetometer according to claim 1, wherein said atomic magnetometer comprises:
a cell having a hollow portion;
an atomic group contained in the hollow portion of said cell to constitute said medium;
a pump beam light source for irradiating said cell with circularly polarized light to polarize a spin of a plurality of atoms constituting said atomic group;
said light source, for the probe beam, for irradiating said cell with linearly polarized light as the probe beam; and
a detector for detecting information on a polarization rotation angle of the linearly polarized light,
wherein an irradiation direction of the circularly polarized light as a pump beam for the atomic group in the cell and an irradiation direction of the probe beam intersect with each other at the first measurement position, and an irradiation direction of the circularly polarized light as a pump beam for the atomic group in the cell and an irradiation direction of the probe beam having passed through the first measurement position intersect with each other at the second measurement position,
wherein a direction of polarization rotation of the probe beam on the basis of the magnetic field intensity at the first measurement position and a direction of polarization rotation of the probe beam on the basis of the magnetic field intensity at the second measurement position are different from each other, and
wherein said atomic magnetometer is configured to directly detect a difference between the magnetic field intensity at the first measurement position and the magnetic field intensity at the second measurement position as the polarization rotation angle.

3. A magnetometer according to claim 2, wherein the first measurement position and the second measurement position are located in a first cell and a second cell, respectively, and a half-wave plate configured to pass the probe beam therethrough is provided between the first cell and the second cell.

4. A magnetometer according to claim 2, wherein the first measurement position and the second measurement position are located in the cell, and optical path turning means for passing the probe beam, having passed through the first measurement position, through the second measurement position with an opposite traveling direction is provided.

5. A magnetometer according to claim 2, wherein the first measurement position and the second measurement position are located in the cell, and
wherein both of the circularly polarized light for irradiation at the first measurement position and the circularly polarized light for irradiation at the second measurement position are either one of right-hand circularly polarized light and left-hand circularly polarized light, and the circularly polarized light for irradiation at the first measurement position and the circularly polarized light for irradiation at the second measurement position have traveling directions opposite from each other.

6. A magnetometer according to claim 2, wherein the first measurement position and the second measurement position are located in the cell, and
   wherein the circularly polarized light for irradiation at the first measurement position and the circularly polarized light for irradiation at the second measurement position have helicity opposite from each other and have the same traveling direction.

7. A magnetometer according to claim 2, wherein said atomic magnetometer is configured to have another measurement position which is different from the first measurement position and the second measurement position which are located in the same cell.

8. A magnetometer according to claim 2, wherein a member including a polarization element for equalizing a light intensity of right-hand circularly polarized light with a light intensity of left-hand circularly polarized light is provided, and
   wherein said atomic magnetometer is configured to pass laser light from said pump beam light source through the member and then to irradiate simultaneously the cell with the right-hand circularly polarized light at the first measurement position and the left-hand circularly polarized light at the second measurement position different from the first measurement position.

9. A magnetic sensing method for measuring a polarization rotation angle of a probe beam by irradiating an atomic group contained in a hollow portion of a cell with a pump beam to uniformize directions of spin of atoms constituting the atomic group and then by irradiating the spin-polarized atomic group of the atoms with linearly polarized light as the probe beam, said magnetic sensing method comprising:
   introducing the probe beam having a plane of polarization rotated by a magnetic field intensity at a first measurement position to a second measurement position different from the first measurement position so as to permit subtraction of the polarization rotation angle of the probe beam; and
   obtaining information on a difference between a magnetic field intensity at the first measurement position and a magnetic field intensity at the second measurement position by measuring the polarization rotation angle of the probe beam having passed through the second measurement position.

* * * * *